US006603209B1

(12) United States Patent
DiStefano et al.

(10) Patent No.: US 6,603,209 B1
(45) Date of Patent: Aug. 5, 2003

(54) COMPLIANT INTEGRATED CIRCUIT PACKAGE

(75) Inventors: Thomas H. DiStefano, Monte Sereno; Konstantine Karavakis, Cupertino; Craig Mitchell, Santa Clara; John W. Smith, Palo Alto, all of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/306,623

(22) Filed: May 6, 1999

Related U.S. Application Data

(62) Division of application No. 08/365,749, filed on Dec. 29, 1994, now Pat. No. 5,929,517.

(51) Int. Cl.[7] .......................... H01L 23/48; H01L 23/52; H01L 29/40
(52) U.S. Cl. ........................ 257/781; 257/780; 257/783; 257/784; 257/673
(58) Field of Search ................................ 257/678, 666, 257/737, 778, 780, 781, 783, 784, 673

(56) References Cited

U.S. PATENT DOCUMENTS

| | | | |
|---|---|---|---|
| 3,390,308 A | 6/1968 | Marley | 361/642 |
| 3,614,832 A | 10/1971 | Chance et al. | 257/785 |
| 3,683,105 A | 8/1972 | Shamash et al. | 174/68.5 |
| 3,832,769 A | 9/1974 | Olyphant, Jr. et al. | 29/626 |
| 3,868,724 A | 2/1975 | Perrino | 257/793 |
| 4,216,577 A | 8/1980 | Badet et al. | 29/831 |
| 4,627,151 A | 12/1986 | Mulholland et al. | 29/569 R |
| 4,628,406 A | 12/1986 | Smith et al. | 361/386 |
| 4,681,654 A | 7/1987 | Clementi et al. | 156/630 |
| 4,701,999 A | 10/1987 | Palmer | 438/124 |
| 4,710,798 A | 12/1987 | Marcantonio | 257/778 |

(List continued on next page.)

FOREIGN PATENT DOCUMENTS

| | | |
|---|---|---|
| EP | 072673 | 8/1982 |
| JP | 60-77446 | 3/1994 |
| WO | WO 89/10005 | 10/1989 |
| WO | WO 89/12911 | 12/1989 |
| WO | WO 94/03036 | 2/1994 |

OTHER PUBLICATIONS

IBM Technical Disclosure Bulletin, Ja. 1985, vol. 27, No. 8, p. 4855.

Microelectronics Packaging Handbook, 1989, pp. 420–423, 1132, Rao R. Tummala and Eugene J. Rymaszewski.

Press Release and attachments, International Microelectronic component Industries, Oct. 1, 1994.

*Primary Examiner*—Jhihan B Clark
(74) *Attorney, Agent, or Firm*—Lerner, David, Littenberg, Krumholz & Mentlik, LLP

(57) ABSTRACT

The present invention provides a method for fabricating a compliant microelectronic device package and an associated apparatus for substantially obviating thermal, compliancy and interconnection problems. Flexible, dielectric layers are used having on a first surface a plurality conductive leads which are each electrically coupled at a first end to at least one conductive pad also coupled to the first surface of the dielectric layers. A second end of the conductive leads are further coupled between the dielectric layers across a bonding gap. A compliant layer is then coupled to the bottom surface of the dielectric layers. One of the dielectric layers is coupled to the surface of a die by one of the compliant layer such that the die bond pads are juxtaposed with respective leads in the bonding gap. This assembly is attached to a protective structure and is encapsulated. A solder mask may be placed over the exposed surface of the dielectric layers to cover the leads and prevent shoring. Further, a conductive layer may be used in the package as a ground layer of a voltage reference layer.

25 Claims, 9 Drawing Sheets

U.S. PATENT DOCUMENTS

| | | | |
|---|---|---|---|
| 4,746,392 A | 5/1988 | Hoppe | 29/841 |
| 4,772,936 A | 9/1988 | Reding et al. | 257/48 |
| 4,812,421 A | 3/1989 | Jung et al. | 257/668 |
| 4,823,234 A | 4/1989 | Konishi et al. | 361/386 |
| 4,829,666 A | 5/1989 | Haghiri-Tehrani et al. | 29/841 |
| 4,837,184 A | 6/1989 | Lin et al. | 257/701 |
| 4,855,867 A | 8/1989 | Gazdik et al. | 361/306 |
| 4,855,868 A | 8/1989 | Harding | 361/386 |
| 4,878,098 A | 10/1989 | Saito et al. | 257/723 |
| 4,893,172 A | 1/1990 | Matsumoto et al. | 257/668 |
| 4,897,534 A | 1/1990 | Haghiri-Tehrani | 235/488 |
| 4,918,811 A | 4/1990 | Eichelberger et al. | 29/840 |
| 4,937,203 A | 6/1990 | Eichelberger et al. | 438/107 |
| 4,967,261 A | 10/1990 | Niki et al. | 257/692 |
| 4,999,319 A | 3/1991 | Hamano et al. | 438/126 |
| 5,029,325 A | 7/1991 | Higgins, III et al. | 187/375 |
| 5,037,779 A | 8/1991 | Whalley et al. | 438/126 |
| 5,055,913 A | 10/1991 | Haghiri-Tehrani | 257/730 |
| 5,127,570 A | 7/1992 | Steitz et al. | 228/103 |
| 5,148,265 A | 9/1992 | Khandros et al. | 257/668 |
| 5,148,266 A | 9/1992 | Khandros et al. | 257/668 |
| 5,258,330 A | 11/1993 | Khandros et al. | 438/125 |
| 5,289,346 A | 2/1994 | Carey et al. | 361/777 |
| 5,304,252 A | 4/1994 | Condra et al. | 134/2 |
| 5,304,512 A | 4/1994 | Arai et al. | 257/112 |
| 5,346,861 A * | 9/1994 | Khandros et al. | 438/125 |
| 5,350,947 A | 9/1994 | Takekawa et al. | 257/702 |
| 5,379,191 A | 1/1995 | Carey et al. | 361/777 |
| 5,394,009 A | 2/1995 | Loo | 257/666 |
| 5,397,921 A | 3/1995 | Karnezos | 257/779 |
| 5,409,865 A | 4/1995 | Karnezos | 257/706 |
| 5,552,631 A | 9/1996 | McCormick | |
| 5,564,181 A | 10/1996 | Dineen et al. | 29/841 |
| 5,681,777 A | 10/1997 | Lynch et al. | |

* cited by examiner

COMPLIANT INTEGRATED CIRCUIT PACKAGE

CROSS REFERENCE TO RELATED APPLICATIONS

The present application is a Divisional of U.S. patent application Ser. No. 08/365,749, now U.S. Pat. No. 5,929,517 filed Dec. 29, 1994, the disclosure of which is hereby incorporated by reference herein.

FIELD OF THE INVENTION

The present invention relates, generally, to integrated circuit packaging, and more particularly relates to methods and devices for packaging microelectronic devices.

BACKGROUND OF THE INVENTION

Microelectronic devices are typically comprised of one or more silicon die/dice having, at least in material part, a multitude of die bond pads on a front surface, a chip body, an interconnection scheme to connect the pads on the die to a supporting substrate and an encapsulant to ensure that the die is protected from contaminants. The combination of these elements is generally referred to as a chip package. The specific function of this package is to protect the die from mechanical, electrostatic and environmental stresses while at the same time providing a thermal path for the heat dissipated from the at least one die during use.

More specifically, chip packages must be able to accommodate for many inherent microelectronic device problems, such as die power dissipation, mismatches in the thermal coefficients of expansion between the chip and its supporting substrate, and increasingly smaller die bond pad pitch, which ultimately allows smaller dies to be used and thus has the potential to produce either smaller packages or more densely packed multi-die packages so long as the interconnection scheme chosen can accommodate the fineness of the pad pitch.

Microelectronic devices are typically connected to external circuitry through contacts on a surface of the chip. The device contacts are generally either disposed in regular grid-like patterns, substantially covering the front surface of the chip (commonly referred to as an "area array") or in elongated rows extending parallel to and adjacent each edge of the chip front surface. The various prior art processes for making the interconnections between such microelectronic devices and their supporting substrates use prefabricated arrays or rows of leads, discrete wires, solder bumps or combinations thereof. For example, in a wirebonding process, the chip may be physically mounted on a supporting substrate. A fine wire is fed through a bonding tool. The tool is brought into engagement with the contact on the chip so as to bond the wire to the contact. The tool is then moved to a connection point of the circuit on the substrate, so that a small piece of wire is dispensed and formed into a lead, and connected to the substrate. This process is repeated for every contact on the chip. The wire bonding process may also be used to connect the die bond pads to lead frame fingers which are then connected to the supporting substrate.

In a tape automated bonding ("TAB") process, a dielectric supporting tape, such as a thin foil of polyimide is provided with a hole slightly larger than the chip. An array of metallic leads is provided on one surface of the dielectric film. These leads extend inwardly from around the hole towards the edges of the hole. Each lead has an innermost end projecting inwardly, beyond the edge of the hole. The innermost ends of the leads are arranged side by side at spacing corresponding to the spacing of the contacts on the chip. The dielectric film is juxtaposed with the chip so that the hole is aligned with the chip and so that the innermost ends of the leads will extend over the front or contact bearing surface on the chip. The innermost ends of the leads are then bonded to the contacts of the chip, typically using ultrasonic or thermocompression bonding. The outer ends of the leads are connected to external circuitry.

In a "beam lead" process, the chip is provided with individual leads extending from contacts on the front surface of the chip outwardly beyond the edges of the chip. The chip is positioned on a substrate with the outermost ends of the individual leads protruding over contacts on the substrate. The leads are then engaged with the contacts and bonded thereto so as to connect the contacts on the chip with contacts on the substrate.

More recently, flip chip configurations have been used. In flip chip configurations, a solder ball is deposited on top of each of the chip contacts and then abutted against respective substrate contacts. The solder balls are then reflowed to provide an electrical connection between the chip and the substrate.

The rapid evolution of semiconductor art in recent years has created a continued demand for progressively greater numbers of contacts and leads in a given amount of space. An individual chip may require hundreds or even thousands of contacts, all within a very small area and many times within the area of the front surface of the chip package. For example, a complex semiconductor chip package in current practice may have a row of contact pads spaced apart from one another at center-to-center distances of 0.15 mm or less and, in some cases, 0.10 mm or less. These distances are expected to decrease progressively with continued progress in the art of semiconductor fabrication. Wire bonding can currently only accommodate a die pad pitch of approximately 100 $\mu$m and TAB bonding allows only a pad pitch or about 70–80 $\mu$m. If a smaller pad pitch were possible in production, it would allow the die size to be reduced for "pad limited" designs where the die perimeter is required to be large enough to fit all of the bond pads.

Further, with such closely-spaced contacts, the leads connected to the chip contacts, must be extremely fine structures, typically less than 50 $\mu$m wide. Such fine structures are susceptible to damage and deformation. With closely spaced contacts, even minor deviation of a lead from its normal position will result in misalignment of the leads and contacts. Thus, a given lead may be out of alignment with the proper contact on the chip or substrate, or else it may be erroneously aligned with an adjacent contact. Either condition can yield a defective chip assembly. Errors of this nature materially reduce the yield of good devices and introduce defects into the product stream. These problems are particularly acute with those chips having relatively fine contact spacing and small distances between adjacent contacts.

Many of the prior art techniques for attachment further run into problems because of the thermal expansion mismatch between the material comprising the microelectronic device and the material comprising the supporting substrate. In other words, when heat is applied to the microelectronic device/substrate combination, they both expand; and when the heat is removed, the device and the substrate both contract The problem that arises is that the device and the substrate expand and contract at different rates and at different times, thereby stressing the interconnections between them. This directly affects the reliability of these connection schemes.

It has been proposed to provide a pressure clamped TAB structure where the outer leads have bumps which can be pressure clamped to respective contacts on the supporting substrate. A compliant pad is then placed over the TAB leads to help hold each of the bumps into electrical contact with corresponding lead contacts on the substrate. However, the compliant pad will eventually take a permanent set, thereby reducing the reliability of the contact force over time. An alternate TAB solution put forth involves replacing the outer lead bond pads of the TAB chip carrier, which connects to the substrate, with an area array of solder balls. The die is then connected to the carrier by means of solder bumps, wire bonds, or TAB inner lead bond pads. The problem here is that the solder balls undergo mechanical stress due to differential thermal expansion of the TAB chip carrier relative to the supporting substrate thereby causing cracking of the solder balls reducing their reliability.

Thermal mismatch issues will be more significant as multiple chip modules grow in popularity. Typically, as more dice are packaged together, more heat will be dissipated by each package which, in turn, means the package will expand to a greater extent thereby further stressing the interconnections. Effective package heat dissipation schemes have thus become increasing important. Typical package cooling schemes include heat sinks and small air fans which are applied or affixed to the back side of the chip body, which is further typically made of ceramic or plastic. One problem with these solutions is that the back layer of the chip package body, to varying degrees, acts as a thermal barrier between the die and the thermal cooling device inhibiting good thermal conduction to the exterior surface of the package.

Further, impedance, inductance and capacitance problems begin to seriously degrade a chip package's performance as the pad pitch becomes finer and the clock speed of a chip is increased. Factors such as the length of interconnection wires and the crosstalk between the chip's interconnections also need to be addressed when a chip package is being designed for the same reason.

To be commercially viable, the aforementioned problems must be solved in a manner which respects the small package size, multichip constraints, fine die bond pad pitch, thermal problems, compliancy problems, electrical problems and in addition must be a cost effective IC package.

Thus, despite the substantial time and effort devoted heretofore to the problems associated with mounting and connecting of microelectronic devices, there are still been unmet needs for improvements in such processes and in the equipment and components used to practice them.

SUMMARY OF THE INVENTION

The present invention provides a method and apparatus for providing a integrated circuit package while substantially obviating thermal, compliancy and interconnection problems.

More specifically, one embodiment of the present invention provides a method of fabricating a compliant microelectronic device package and an associated apparatus, wherein a flexible, dielectric layer having on a first surface a plurality of conductive leads which are each electrically coupled at a first end to a conductive pad on the first surface of the dielectric layer. A second end of each conductive lead is further coupled to a first surface of a removable film across a bonding gap. A first surface of a compliant layer is coupled to a second surface of the dielectric layer and the removable film is supported atop a first surface of an IC die. Each conductive lead is then detached and bonded to a respective juxtaposed die bond pad. At this point the removable film is no longer attached by the conductive leads and may be removed from the first surface of the die creating a die window. A second surface of the die and a second surface of the compliant layer is next attached to an interior surface of a protective structure, such as a heat spreading enclosure. A liquid encapsulant is then introduced between the die and the dielectric layer and is cured at a suitable temperature.

In an alternate embodiment, the removable film from the preceding embodiment, comprising a second flexible dielectric layer, can be coupled to the first surface of the die using a second compliant layer. The second dielectric layer further having a plurality of the second conductive leads each electrically coupled at a first end to at least one second conductive pad also coupled to the first surface of the second dielectric layer. A second end of each of the second conductive leads is then coupled to the first surface of the first dielectric layer across the bonding gap. Each of the conductive leads may then be detached within or near the bonding gap and bonded to respective juxtaposed die bond pads on to the first surface of the die. This embodiment thus provides a compliant microelectronic package having perimeter and center conductive pads.

These embodiments can also make use of a specific point of detachment on each of the conductive leads within or near the perimeter of the bonding gap to better determine the point of detachment of the lead. This embodiment may further have a conductive layer coupled to the second surface of the dielectric layer, between the dielectric layer and the compliant layer. This conductive layer can be used as a ground layer or a voltage reference layer and can be selectively coupled to any of the conductive pads through a conductive via through the thickness dimension of the dielectric layer. The conductive layer further helps to shield electrical transients between the contact pads when the device is in use. A solder mask, coupled to the first surface of the first and second dielectric layer, may also be used to electrically shield the conductive leads and cover the die window, but not shield the conductive pads. A small hole in the solder mask, aligned with the bonding gap, can further be used to introduce the liquid encapsulant between the die and the solder mask. The solder mask also performs the function of preventing the liquid encapsulant from overflowing onto the conductive pads.

A further embodiment of the present invention includes a method of fabricating a compliant microelectronic device package and an associated apparatus having its conductive leads and pads on alternate surfaces of a dielectric layer. More specifically, this embodiment includes providing a first and a second flexible dielectric layer lying in a common plane with a space between them defining a bonding gap. The first and second dielectric layers respectively having on a first surface a first and second conductive pad and on a second surface a first and second conductive lead. The first and second conductive pads are coupled respectively to the first and a second conductive leads through a conductive via in the first and second dielectric layers. A first surface of a third and fourth flexible, dielectric layer are coupled respectively to the second surface of the first and second dielectric layers, wherein an end of the second conductive lead is attached between the first and third dielectric layers such that the second conductive lead bridges the bonding gap. A third conductive lead is then coupled to a second surface of the third dielectric layer and coupled to the first conductive lead through a conductive via extending from the first to the second surface of the third dielectric layer. An end of the third conductive lead is further coupled between the second and fourth dielectric layers such that the third conductive lead bridges the bonding gap. A first and second compliant layer, each having a first and second surface, wherein the first surface of the first and second compliant layer are coupled to a respective second surface of the third and fourth dielectric layers. A die having a first and second surface and a plurality of die bond pads is next coupled on its first surface to a second surface of the second compliant layer, and the second surface of the first compliant layer and the second surface of the die are attached to an interior surface of a protective structure. The second and third conductive leads are then detached and bonded to a respective juxtaposed die bond pad, and a liquid encapsulant is introduced between the die and the dielectric layer and cured.

The attached ends of the second and third may alternately be sandwiched between the respective dielectric layers or the leads may be coupled to one of the opposing dielectric layers, either way holding them in place over the bond gap.

A conductive layer may be added to the first surface of the first and second dielectric layers and selectively coupled to the first and second conductive pads, thereby providing for a ground of reference voltage plane. A solder mask may further be affixed atop the conductive layer so that the leads are protected from electrically shorting but the contact pads are exposed so they may be connected to the contacts on a supporting substrate. A hole may also be provided from the exposed surface of such a solder mask to the second surface of the conductive layer and aligned over the bonding gap so that the liquid encapsulant may be injected between the die and the conductive layer.

The foregoing and other objects and advantages of the present invention will be better understood from the following Detailed Description of a Preferred Embodiment, taken together with the attached Figures.

DETAILED DESCRIPTION OF A PREFERRED EMBODIMENT

Figure 1:
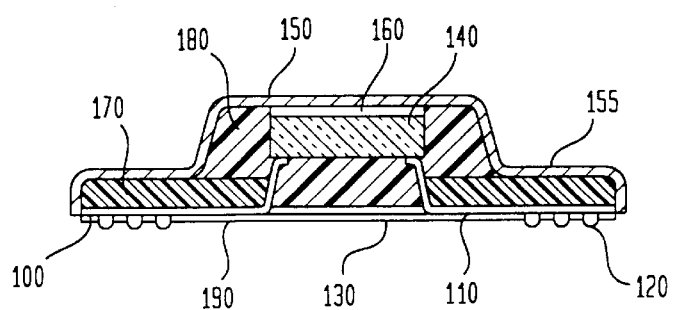
FIG. 1 shows a side view of one embodiment according to the present invention.

FIG. 1 shows a side view of one embodiment of the present invention. A flexible, but substantially inextensible, film circuit element (or "flex circuit") 100, preferably formed from a polymeric material such as Kapton™, of an approximate thickness between 25 and 100 microns is used as a flexible, intermediate substrate having lithographically pre-formed flexible, conductive leads 110 and bumps 120 (which may be comprised of plated bumps, solder balls, etc.) on a first surface. The conductive leads 110, which are typically between 20 to 30 microns thick, connect a plurality of bumps 120 to at least one respective die bond pad, as is discussed in greater detail hereinafter. The flex circuit 100 further has a bond window 130 through which the conductive leads 110 are attached to the die bond pads (not shown) on the front surface of the at least one die 140. A back surface of the die 140 is coupled to an interior surface of a protective structure 150 generally using a snap cure adhesive 160 or another suitable method for attaching the die 140 to the protective structure 150. The protective structure 150 further has a shelf section 155 encircling the die to provide support for the bumps 120.

A compliant layer 170, typically an elastomeric pad, is placed between and coupled to a second side of the flex circuit 100 and the front side of the shelf section 155 of the protective structure 150 to accommodate for the temperature coefficient of expansion mismatch which occurs after the bumps are attached to a supporting substrate, such as a printed wiring board, and the die 140 begins to expand at a different rate than the supporting substrate due to the die's dissipation of heat during operation. The open area in the interior of the protective structure 150 is filled with an elastomeric encapsulant 180 to protect the die 140 from contamination due to dust, moisture or the like, as is disclosed in more detail in the commonly owned U.S. patent application Ser. No. 08/246,113, filed May 19, 1994. A flexible protective dielectric layer 190 is placed over the first side of the flex circuit 100 electrically isolating the conductive leads 110, but leaving the bumps 120 so that they may be electrically coupled to a supporting substrate. Dielectric layer 190 further extends across the bond window 130.

Figure 2:
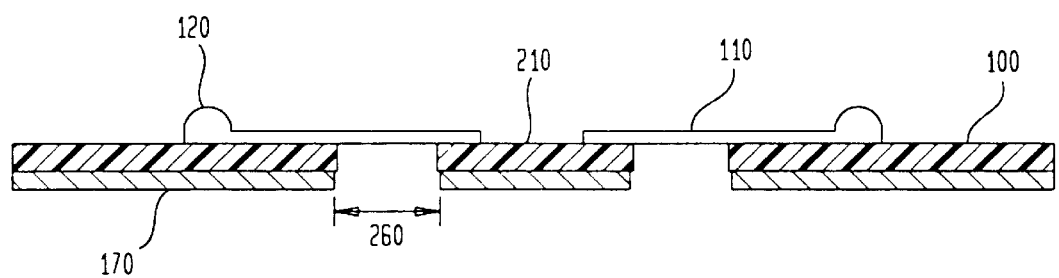
FIG. 2 shows a side view of a flex circuit according to the present invention.

Referring now to FIG. 2, the process begins by lithographically forming the flexible, conductive leads 110 on a first surface of the flex circuit 100 thereby coupling the leads 110 between the bumps 120 on a first end of the lead 110 and a removable flex film structure 210 on a second end of the lead 110. The bumps 120 are preferably comprised of nickel or copper of approximately 90 microns in height and 300 microns in diameter. Typically, a one micron thick gold (or gold cobalt alloy) coating will further be flash plated on the surface of each of the bumps 120 to protect the bumps from oxidation and to enhance the bonding of the bumps to a supporting substrate.

The flex film 210 is similar to flex circuit 100 in that it is typically comprised of a flexible, substantially inextensible film circuit element formed from a polymeric material such as Kapton®, and is attached to a second end of lead 110. In effect, the flex film 210 is an island which is attached to and completely supported by the leads 110 which are generally placed on all four sides of the flex film 210. This arrangement creates a bonding gap 260 between the flex circuit 100 and the flex film 210. In practice, the flex film 210/bonding window 130 structure may be created by laser ablating or punching a "picture frame" portion from flex circuit 100.

The compliant layer 170, which is typically made of an elastomer material such as the Dow Corning silicone elastomer 577 known as "Silgard®", is next adhered to the second surface of the flex circuit 100 and the flex film 210 typically by conventional stencil printing techniques. The silicone elastomer used in the preferred embodiment is filled with about 5–10% of fumed silica in order to obtain a stiff consistency that allows the stenciled layer to retain its shape after the stencil is removed. The fumed silica also improves the thermal conductivity of the elastomer and further reduces the thermal coefficient of expansion of the elastomer. The silicone is then cured at a suitable temperature.

Figure 3:
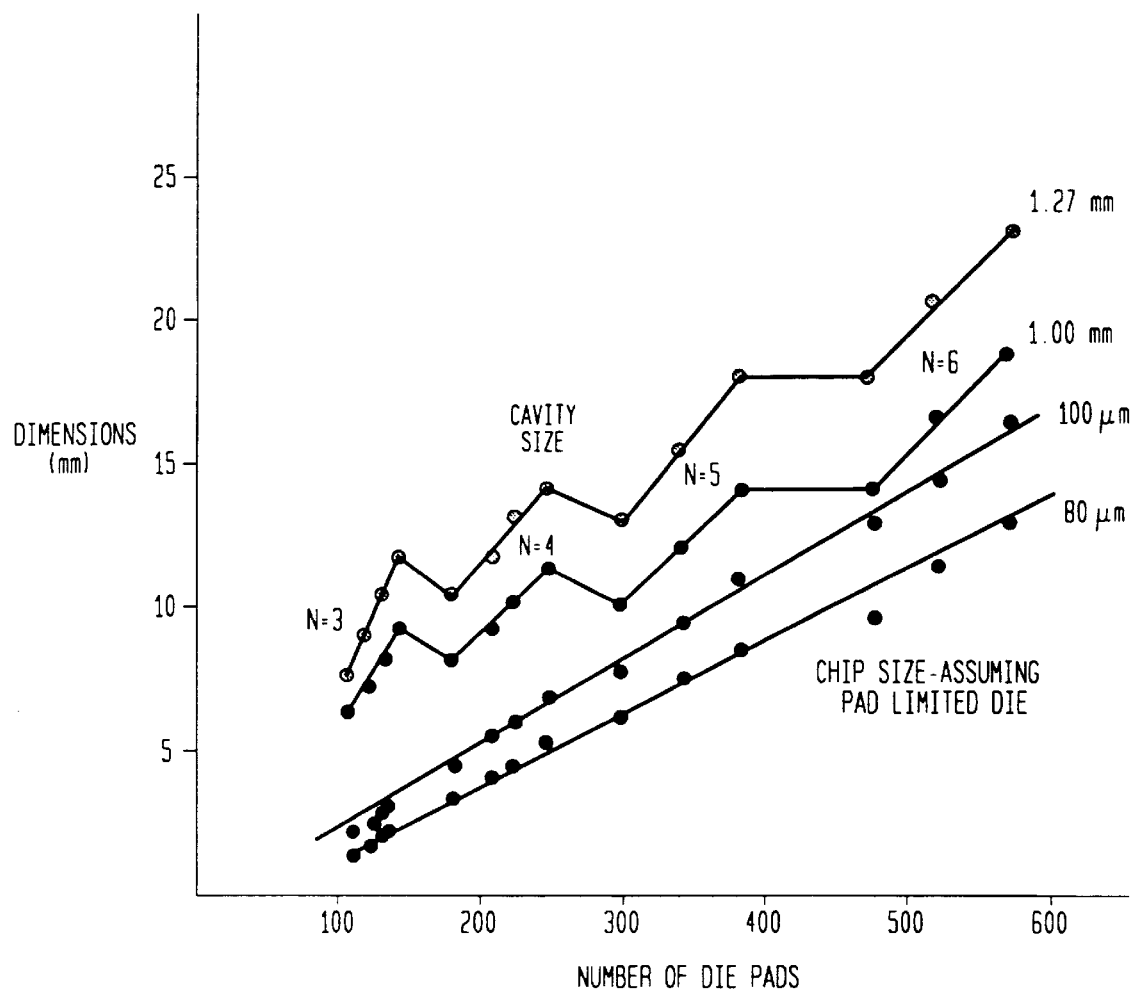
FIG. 3 shows a chart comparing various package characteristics according to the present invention.

Preferably, there is a sufficient number of bumps 120 so that at least one bump 120 is provided for each die bond pad 200. If a pad limited die is assumed, Table 1 provides typical bump configuration information. The standard bump array sie may thus be chosen from Table 1 so that a large number of applications may be supported with a minimum number of size and tool configurations.

approximately 2.7 mm on a side allowing for a good amount of room to bond to the die bond pads given the difference between the bonding window size and the die size. Given this die geometry, 27 die bond pads per side will result, further resulting in a total of 108 die bond pads for the square die in this example. This provides one bump per die pad. While the number of allowable pins on the periphery of a die increases fairly linearly with die size, the corresponding bonding window size and number of rows of bumps relative to the number of pins on the die is not linear, as shown in FIG. 3. As stated earlier, the values shown in Table 1 are exemplary only and should not be construed as a limitation on the present invention.

Figure 4:
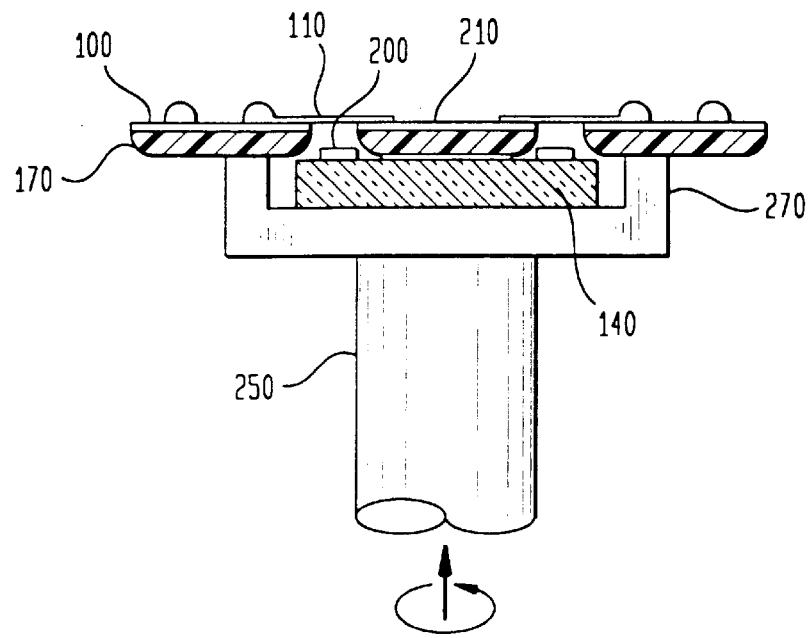
FIG. 4 shows a before bonding side view of a flex circuit and die according to the present invention.

Referring now to FIGS. 4–8, the assembly shown in FIG. 2 is next mounted to the die 140. In FIG. 4, the die 140 is first placed with the die bonding pads 200 pointing upward in an aligning device 250, such as a vacuum platen/support post combination, which positions and aligns the die 140 in the x, y, z and θ directions. The assembly shown in FIG. 2 is then placed over the top of the aligning device 250 so that projections 270 on the aligning device 250 may provide support for the flex circuit 100 and allow the flex film 210 to rest atop the center of the die 140. The compliant layer 170 further supports the flex circuit 100 and the flex film 210 and maintains the conductive leads 110 at a fixed height above the die's surface. Each die bond pad 200 is thus aligned beneath a respective conductive lead 110.

Figure 5:
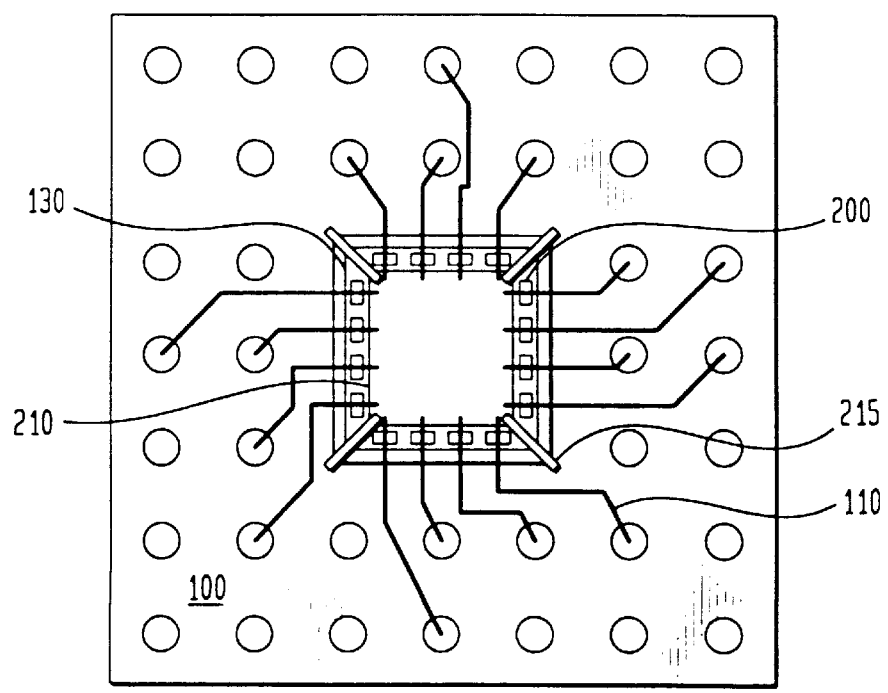
FIG. 5 shows a before bonding top view of a flex circuit and die according to the present invention.

FIG. 5 shows a bottom view of the embodiment shown in FIG. 4 before the conductive leads 110 are bonded to the die bond pads 200. As described above, each conductive lead

TABLE 1

| Grid Array | Bonding Window | Rows Deep | No. of Bumps | % Bump Coverage | Bonding Window size 1.0 mm | 1.27 mm | Die Size 100 μm | 80 μm |
|---|---|---|---|---|---|---|---|---|
| 12 × 12 | 6 × 6 | 3 | 108 | 75 | 6 mm | 7.6 mm | 2.7 mm | 2.2 mm |
| 13 × 13 | 7 × 7 | 3 | 120 | 71 | 7 | 8.9 | 3.0 | 2.4 |
| 14 × 14 | 8 × 8 | 3 | 132 | 67 | 8 | 10.2 | 3.3 | 2.6 |
| 15 × 15 | 9 × 9 | 3 | 144 | 67 | 9 | 11.4 | 3.6 | 2.9 |
| 16 × 16 | 8 × 8 | 4 | 192 | 75 | 8 | 10.2 | 4.8 | 3.8 |
| 17 × 17 | 9 × 9 | 4 | 208 | 72 | 9 | 11.4 | 5.2 | 4.2 |
| 18 × 18 | 10 × 10 | 4 | 224 | 69 | 10 | 12.7 | 5.6 | 4.5 |
| 19 × 19 | 11 × 11 | 4 | 240 | 66 | 11 | 14 | 7.0 | 5.6 |
| 20 × 20 | 10 × 10 | 5 | 300 | 75 | 10 | 12.7 | 7.5 | 6.0 |
| 22 × 22 | 12 × 12 | 5 | 340 | 80 | 12 | 15.2 | 9.6 | 7.7 |
| 24 × 24 | 14 × 14 | 5 | 380 | 63.7 | 14 | 17.8 | 10.8 | 8.6 |
| 26 × 26 | 14 × 14 | 6 | 480 | 71 | 14 | 17.8 | 12.8 | 9.6 |
| 28 × 28 | 14 × 14 | 6 | 528 | 67 | 16 | 20.3 | 14.7 | 11.8 |
| 30 × 30 | 18 × 18 | 6 | 576 | 67 | 18 | 22.9 | 16.1 | 12.9 |

Taking the first row of entries in Table 1 as an example, a 12×12 grid array provides 12 rows of 12 bumps each for a total of 144 bumps. Since the flex circuit has a bonding window for the die, the number of bumps which would have been included had the bonding window not been provided must be subtracted from the total number of bumps, i.e. for a bonding window which will take up an area that would have provided a 6x6 bump grid array, 36 bumps must be subtracted from the 144 bump total given above. Thus, in this example, 108 bumps in three rows encircle a centrally located bonding window. This corresponds to a 75% coverage of the bump grid array on the flex circuit. If the bumps, in this example, are on a 1.0 mm pitch, the bonding window may be approximately 8 mm on each side, assuming a square bonding window. Further assuming a 100 μm die bond pad pitch on a single square die, the die may be 110 is fixedly held in place on either side of the bonding gap 260 between the flex circuit 100 and the flex film 210 such that a portion of each lead 110 is suspended above a respective die bond pad 200 in the bonding gap. Alternately, each of the conductive leads 110 may be connected to a common center structure coupled to the first surface of the flex film 210 to provide added adherence of the leads 110 to the flex film 210 which, in turn, aids in bonding the leads 110 to the die bonding pads 200, described in greater detail below. A preferred embodiment of the invention also includes the holding straps 215 which provide a mechanical means to better secure the flex film 210 in place when the leads 110 are being bonded to the die bond pads 200. The holding straps 215 may be secured to any portion of the flex circuit 100 and removable film 210 that will provide the added bonding support without electrically shorting the leads 110. Further, the holding straps 215 may be comprised of a conductive material, similar to how the leads 110 are formed, or the straps 215 may be formed of a dielectric material, which helps ensure the straps 215 do not electrically short the leads 110. After the leads have been bonded (as described in greater detail below), the holding straps 215 may be removed.

Figure 6:
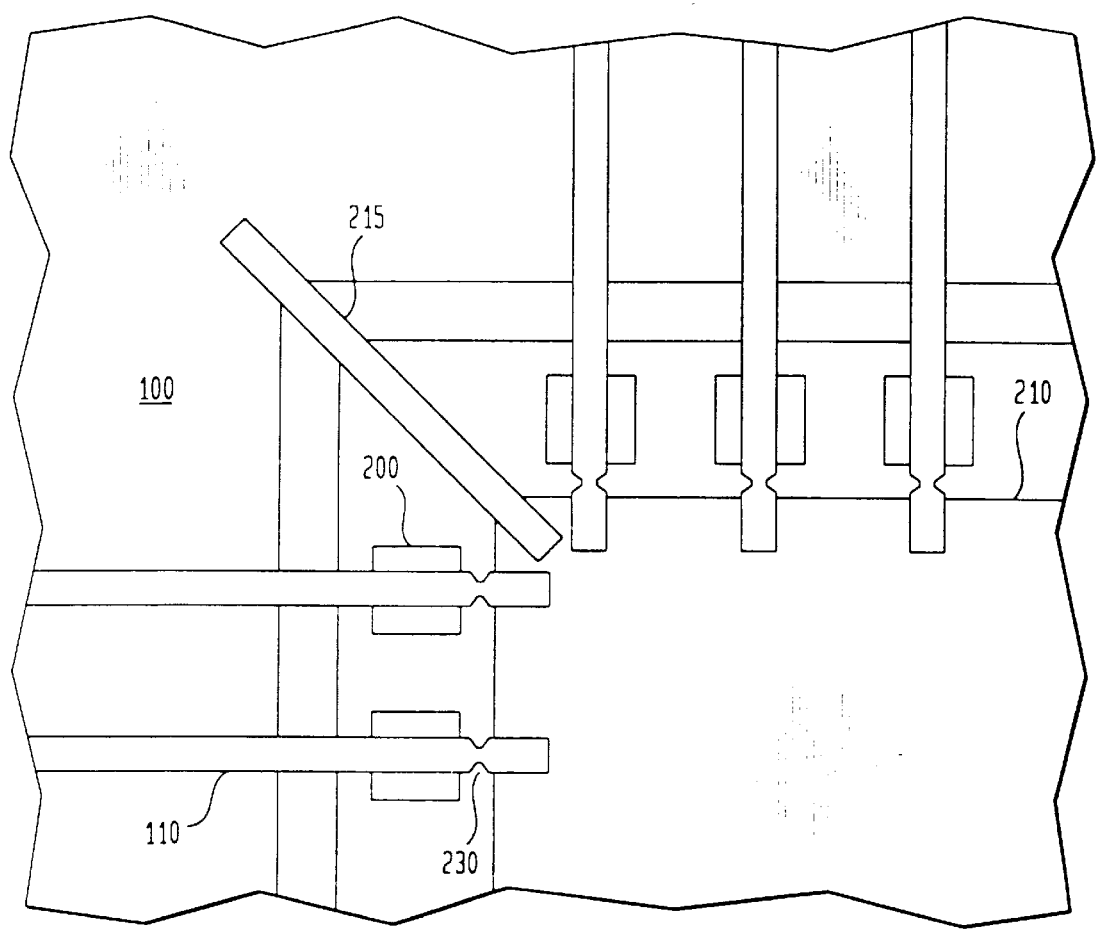
FIG. 6 shows a magnified before bonding top view of a flex circuit and die according to the present invention.

FIG. 6 shows a magnified view of FIG. 5. Each conductive lead 110 has a highly conductive joining layer (not shown), such as a 2.5 to 5 micron thick layer of 99.99% gold or gold plated on nickel, which may be disposed on the side of the lead 110 facing the die bonding pad 200 or may extend completely around the conductive lead 110 within the bonding gap between the flex circuit 100 and the flex film 210. Alternately, the entire conductive leads 110 can be comprised of gold or a gold alloy. As shown in FIG. 3, each conductive lead 110 further has a detachment point 230, typically positioned within the bonding gap, which facilitates fracture of the lead. This detachment point 230 can also be located just inside of the perimeter of the flex film 210. Although the detachment point 230 is shown in FIG. 4 as a notched element, the detachment point 230 may also be accurately thought of as simply a "weak" point in the conductive lead 110 which allows for the fracture of the lead at the weak point The detachment point 230 can be created by any suitable means, such as selectively plating or etching the lead, scoring the lead, creating a "thin" area in the lead either in width or depth or not coupling the highly conductive layer to a small portion of the conductive lead within the bonding gap. This detachable lead feature is described in greater detail in commonly owned U.S. patent application Ser. No. 07/919,772, filed on Jul. 24, 1992.

Figure 7:
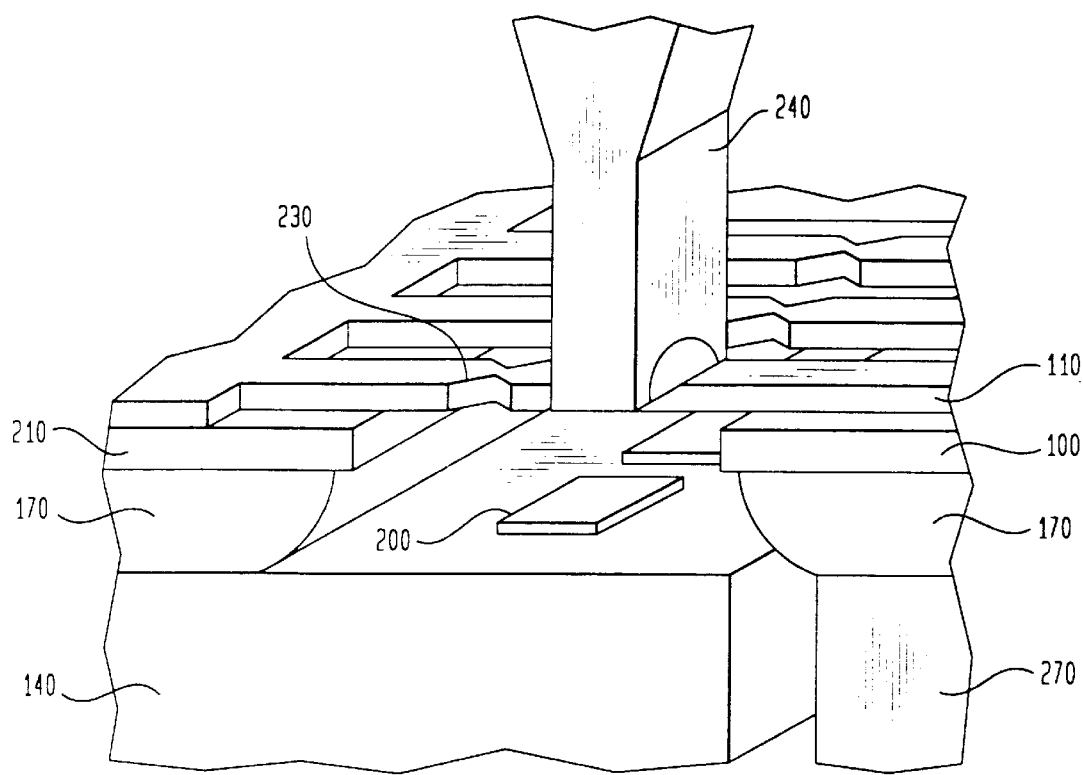
FIG. 7 shows a before bonding perspective view of a bonding tool and unbonded leads according to the present invention.

Referring now to the perspective drawing in FIG. 7, each flexible, conductive lead 110 is separated at its detachment point 230 and bent towards the die bonding pads 200 until the surface of the highly conductive joining layer contacts the die bonding pads 200 of die 140. Thus, the bonding gap 260 must be sufficiently large to allow for the thickness of the compliant layer. As stated above, the portion of each conductive lead 110 within the bonding gap 260 is supported during the bonding phase on one side by the flex circuit 110, which in turn is supported by the compliant layer 170 and by the projections 270 of the aligning device 250. Each lead is supported on the other side of the bonding gap 260 by the flex film 210, the compliant layer 170 and the die 140. Typically, the bonding action is accomplished by using a bonding tool 240 having an elongated groove in its bottom surface which is positioned above each contact so that the groove extends in a preselected groove direction and extends across the top of a contact. The connection sections of the leads extend generally parallel to the groove direction, so that when the bonding tool is advanced downwardly to engage the lead 110, the connection section of each lead is seated in the groove. If the lead 110 is slightly out of alignment with the groove, the lead 110 will be moved in lateral directions, transverse to the groove, until it seats in the groove and thus becomes aligned with the die bonding pads 200. The bonding tool described herein is more fully disclosed in commonly owned U.S. patent application Ser. No. 096,700, filed Jul. 23, 1993.

Figure 8:
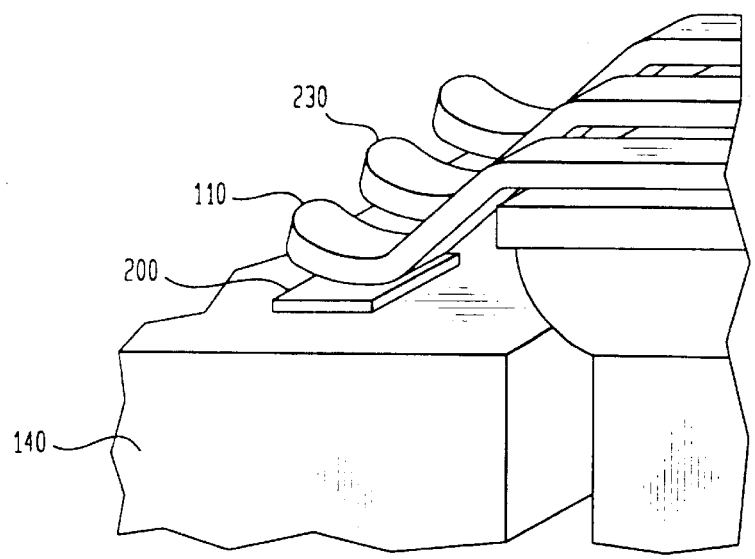
FIG. 8 shows a perspective view of the leads after bonding according to the present invention.

FIG. 8 shows a perspective drawing of each conductive lead 110 after it has been separated at its detachment point 230 and bent toward the die bonding pad 200. The leads 110 are then attached to the die bonding pads 200 by any suitable means, such as ultrasonic, thermosonic or compression bonding. The actions of detaching, bending and attaching the leads 110 are all typically performed with the bonding tool 240, shown in FIG. 7. After each of the conductive leads have been separated from the flex film 210 at their detachment points and bonded to their respective die bonding pad 200 on die 140, the flex film 210 is no longer attached and may simply be removed. If the holding straps 215 are used, they will be removed at the same time by breaking or peeling each strap off near the edge of the bonding gap 280 nearest flex circuit 110. At this point, the die 140 is attached to the flex circuit by each of the bonded conductive leads 110.

The flexible, protective dielectric cover layer (or "solder masks") 190 in FIG. 1 is coupled to the first surface of the flex circuit and is typically between 25–50 $\mu$m thick. The solder mask 190 is further typically composed of a polyimide, acrylic or epoxy sheet having preformed holes to allow the bumps 120 to extend therethrough. Preferably, the solder mask is vacuum laminated to the top layer of the semiconductor chip assembly and covers the entire first surface of the flex circuit including the bonding window 130, except for the bumps 120. Alternately, a solder mask 190 may be coupled to the entire circuit area of the flex circuit 100. Holes corresponding to the bumps 120 may then be created by lithographically exposing and developing the solder mask such that the bumps 120 extend therethrough. Preferably, an encapsulation hole is made in the solder mask 190 so that elastomeric encapsulant may be disposed within the open indentation area of the protective structure, as described below. The elastomer encapsulant is typically cured prior to any step of exposing the solder mask to reveal the bumps 120 so that the bumps do not become contaminated by the encapsulant.

A protective structure 150 is next placed between the back surface of the die 140 and the aligning device 250 and the die is coupled to the interior surface of the protective structure 150 typically using a snap cure, thermally conductive die attach adhesive, as described above in reference to FIG. 1. It should be noted that the protective structure may also be coupled to the structure shown in FIG. 2 prior to the bonding step. The protective structure 150 performs three functions. First, it protects the die and the flex circuit. Second, the protective structure 150 is used to conduct heat from the back of the die 140 to the surrounding environment and third, the shelf section 155 provides support for the bump grid array when it is attached to a supporting substrate. For thermal transfer purposes, the protective structure 150 optimally is comprised of an highly conductive material, such as copper, copper-tungsten, aluminum or aluminum nitride among others. Further, the protective structure 150 is directly attached to the back surface of the die 140 to aid in the conduction of heat from the die through the protective structure 150. Because the die 140 will heat up more quickly than the protective structure 150, the preferred embodiment of the invention uses a protective structure 150 which has a thermal coefficient of expansion (TCE) as closely matched to the TCE of the die 140 as possible while still retaining the structure's 150 thermal transfer properties. Because the protective structure 150 is directly attached to the back surface of the die 140, matching the TCE characteristics allows the protective structure 150 to expand and contract as the die expands and contracts. Alternately, a conductive grease could be substituted for the snap cure adhesive to add compliancy between the protective structure 150 and the die 140 while still maintaining a good thermal path to dissipate the die's heat.

The shelf section 155 of the protective structure 150 is coupled to the compliant layer 170 and must further have sufficient rigidity to provide the needed support for the bump grid array. The shelf section may be coupled using a snap cure adhesive or a tacky elastomer film, of typically the same material the complaint layer is composed of, may be provided on the top surface of the compliant layer 170 and cured after the shelf section 155 is attached, so as to bond the shelf section 155 to the compliant layer 170.

Figure 9:
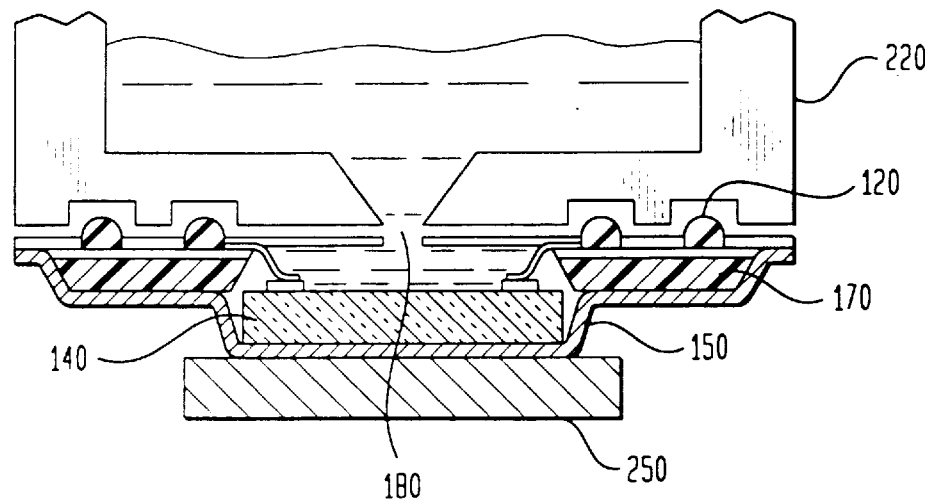
FIG. 9 shows an encapsulation step according to the present invention.

Referring now to FIG. 9, the open area, defined by the protective structure 150, the compliant layer 170 and the solder mask 190, provides a bounded encapsulation area. The encapsulant 180 performs the function of protecting the die 140 from contamination due to dust, moisture or the like, as is discussed above in reference to FIG. 1. Typically, a liquid encapsulant 180, such as the complaint elastomeric material used for the compliant layer 170, is dispensed into the open area by a encapsulant filled injection head 220 through the hole in the protective layer. Solder mask 190 substantially prevents the encapsulant from contacting or affecting the conductivity of the bumps 120. The vacuum platen 250 holding the protective structure 150 may be heated to between 160° C. and 180° C. in order to cure the encapsulant 180 sufficiently to prevent its running out of the hole in the solder mask 190. Preferably, the hot platen 250 also cures the adhesive coupling the die 140 to the protective structure 150 and the compliant layer 170 to the shelf section 155 at the same time as it cures the encapsulant 180. At this point, the microelectronic device is complete and may be removed from the vacuum platen 250.

Figure 10A:
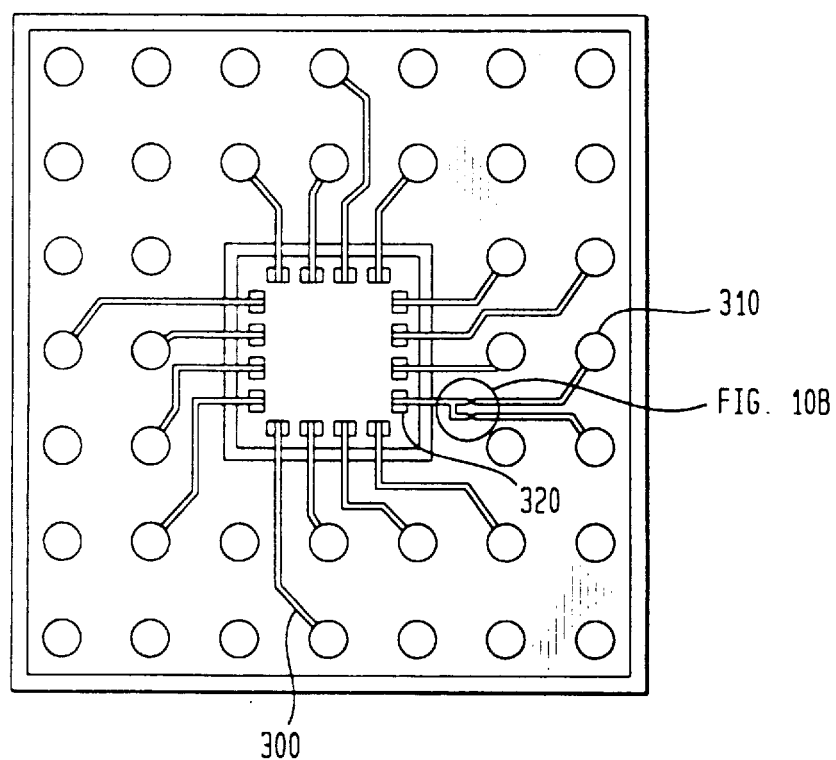
FIGS. 10A–B show a top view of an alternate embodiment having programmable discretionary wiring according to the present invention.
Figure 10B:
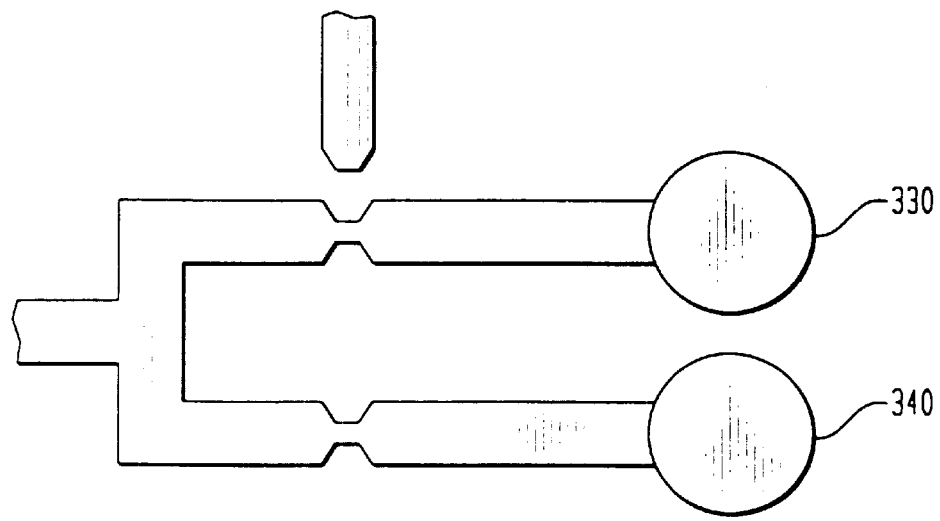

FIG. 10A shows a bottom view of an alternate embodiment of the present invention in which the conductive leads 300 may connect more than one terminal 310 to the same die bond pad 320. Thus, a multiply-connected lead 300' has a bond region 333 which is aligned with a bond window 301 in the dielectric element 337. Bond region 333 is adapted for connection to the chip contact, also referred to as a die bond pad, 320. The bond region 333 is connected to two terminals 310a and 310b through two connecting regions 335a and 335b, shown in magnified view in FIG. 10B. These two connecting regions 335a and 335b constitute a plural set of connecting regions. the dielectric film 337 has a disconnection window 331, and the connecting regions 335a and 335b extend across this disconnection window. Thus, the connection regions 335a and 335b can be servered selectively by advancing a tool 340 so as to engage the connection region which is to be disconnected and by forcing the tool into the disconnection window. As shown in the drawing, the connection regions may have weak points 341 to facilitate such severance. Alternatively, the connection regions may be selectively disconnected using etching or scribing techniques generally known in the art to electrically disconnect one of the bumps from the die bond pad by creating a non-conducive region.

Figure 11:
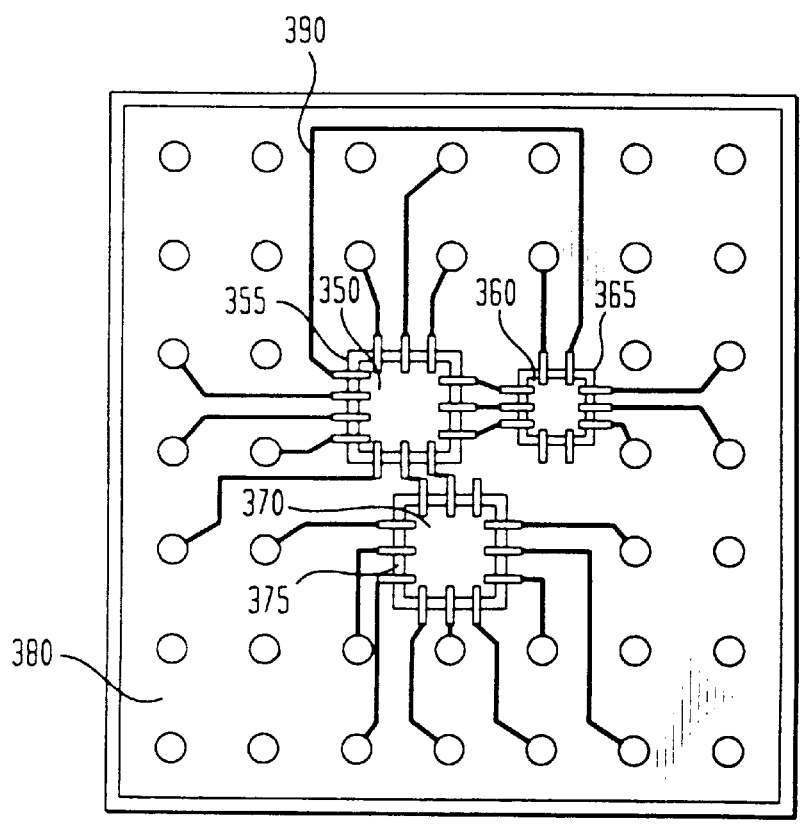
FIG. 11 shows a top view of a further alternate multiple die embodiment according to the present invention.

FIG. 11 shows a bottom view of a multi-die embodiment of the present invention in which a plurality of dies (350/360/370) may be mounted to the same flex circuit 380 and combined into a single package. In this embodiment, the flex circuit 380 has a discrete bonding window (355/365/375) for each die and each die is coupled to the conductive leads 390 in the same detachable lead/bonding tool manner as described above in reference to FIGS. 4–8. This embodiment further shows that the conductive leads 390 may be used to interconnect die bonding pads on the same die or between multiple dies.

Figure 12:
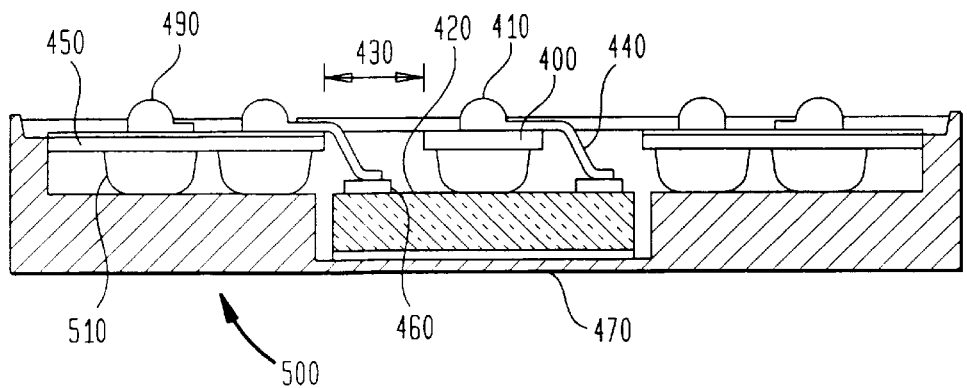
FIG. 12 shows a top view of a still further alternate embodiment according to the present invention.

Referring now to the alternate embodiment of FIG. 12, the assembly includes a first flex circuit 450, similar to the flex circuit 100 discussed above, and a second flex circuit 400. Flex circuit 400 is similar to the removable flex film structure 210 shown in FIG. 2 in that it is disposed within the central aperture creating a bonding gap 430 between the two flex circuits (400/450). A plurality of plated or solder bumps 410/490 are positioned on each of the flex circuits and are attached to the die bond pads 460 through the bonding gap 430 through the use of flexible leads 440, described earlier. The addition of the second flex circuit 400 replaces at least a portion if not all of the bumps removed by the bonding window shown in FIG. 1 and described in conjunction with the second column of Table 1. This embodiment allows a greater number of bumps 410 on the front surface of the chip package; and thus, a greater number of die bond pads 460 along the periphery of the die 470. This embodiment also provides further bump 410 to die bond pad 460 selectibility.

Figure 13:
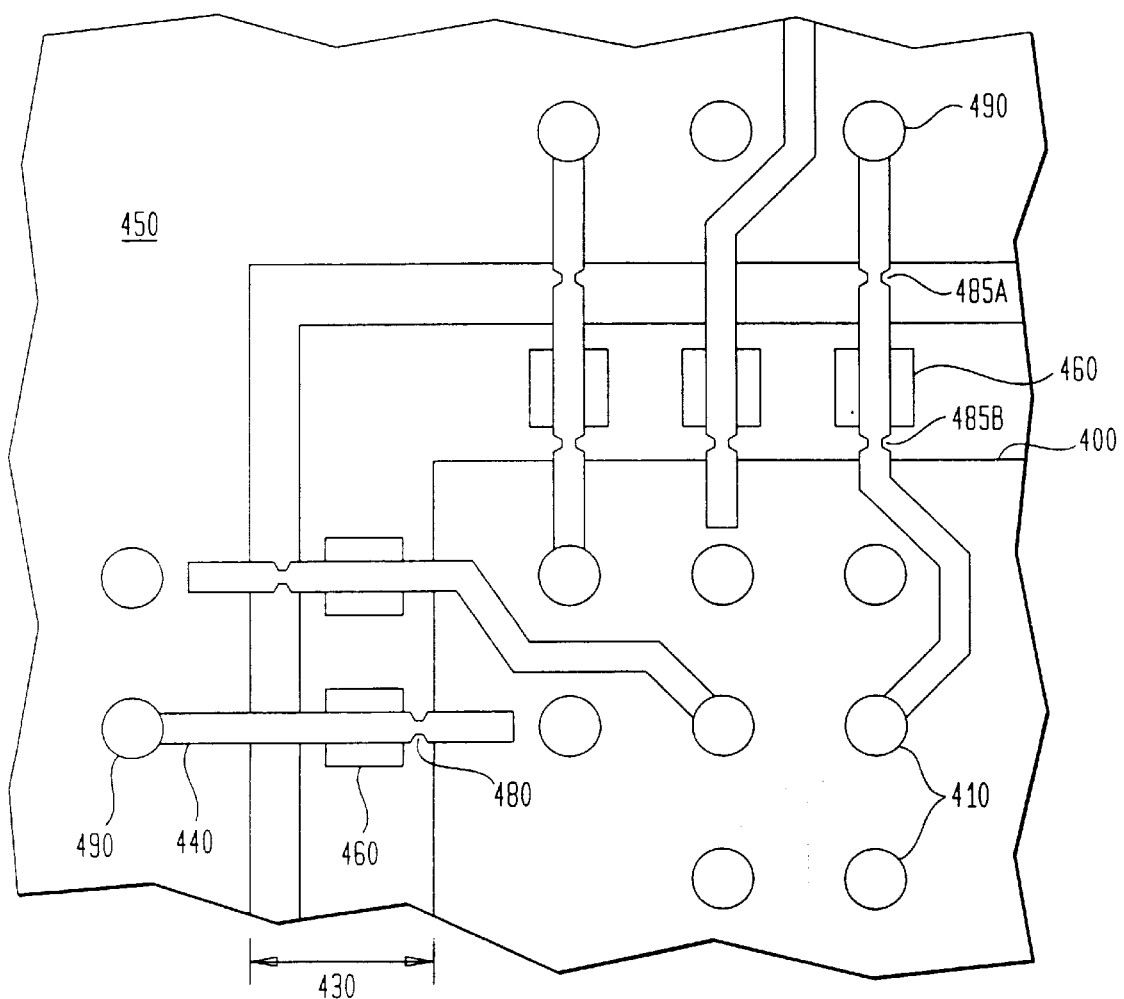
FIG. 13 shows a magnified top view of a still further alternate embodiment having both fan in and fan out leads according to the present invention.

As can be better seen in FIG. 13's magnified view of FIG. 12, the same method of attaching the first flex circuit to the die bond pads, described in reference to FIGS. 4–8, can be used to attach the bumps 410 on the second flex circuit 400 to the die bond pads 460. The conductive leads 440 are coupled on either side of the bonding gap 430 to the first surface of the first and second flex circuits (450/400) such that a portion of the lead 440 is suspended over the bonding gap 430. The detachment point 480 is placed on the far side of the bonding gap 430 relative to the bump which is to be electrically connected to its respective die bond pad. Alternately and expanding upon the concept shown in FIGS. 10A and 10B, a conductive lead 440 having dual detachment points 485A/485B can be provided across the bonding gap 430 so that the bonding tool, described above, may selectively couple one of the bumps (410/490) to the die bond pad 460 while simultaneously ensuring that the other bump (410/490) will not be electrically connected to the same die bond pad 460. The localized stress placed on one of the dual detachment points, for example point 485A, by the bonding tool will cause it to separate the detachment point connection 485A before the lead's other detachment point 485B is substantially affected. It should be noted that the second flex circuit feature shown in FIGS. 12–13 can also be used with the multi-die embodiment shown in FIG. 11 and described above.

FIG. 12 further shows an alternate protective structure 500 having a substantially flat back surface across the entire chip package. This embodiment gives added rigidity, and thus added support for the opposingly positioned bumps 490. This embodiment further better spreads the heat dissipated from the die throughout the entire chip package; however, the structure 500 will also retain that heat longer than the protective structure 150 shown in FIG. 1 because of the structure's 500 greater mass. For this reason, a conductive grease may be used in some applications to mate the back surface of the die 470 to the protective structure 500 to give the connection added compliancy. The back surface of the die 470 directly attaches to the interior surface of the protective structure 500 to aid in the conduction of heat from the back surface of the die 470 through the structure 500. Likewise, the protective structure 500 is comprised of a highly conductive material and further has a TCE which is matched as closely to the die's TCE as possible to also aid in the heat conduction away from the die 470 and to limit the problems encountered when a die expands more quickly than its attached protective structure. This embodiments substantially flat back surface also allows a larger, conventional heat sink to be attached than does the protective structure 150 shown in FIG. 1. In another alternate embodiment, the protective structure can be in the form of a substantially flat ring surrounding the die and supporting the bumps without enclosing the back surface of the die (similar to having just the shelf section 155 of the protective structure 150 shown in FIG. 1). This embodiment would allow a heat sink/spreader to be attached directly to the back surface of the die thereby improving the transfer of heat from the die to the heat sink.

FIG. 12 further provides an alternate compliant layer. The complaint layer shown in FIG. 12 is comprised of elastomeric pads 510 which may be stenciled and cured on the second surface of the flex circuits and may be comprised of a silicone elastomer such as "Silgard®". The pads 510 are positioned beneath or around each of the bumps (410/490) to provide adequate support for the bumps when they are mated to the contacts on a supporting substrate, such as a printed wiring board. However, the preferred embodiment also provides sufficient support at the edge of the bonding gap to provide support during the lead detachment/bonding steps. The area between these elastomeric pads may be filled with liquid encapsulant which is cured and controlled as described above in reference to FIG. 9. Alternately, the entire compliant/encapsulation layer between the two flex circuits and the die/protective structure may be formed through the injection molding process described above in connection with FIG. 9.

Figure 14:
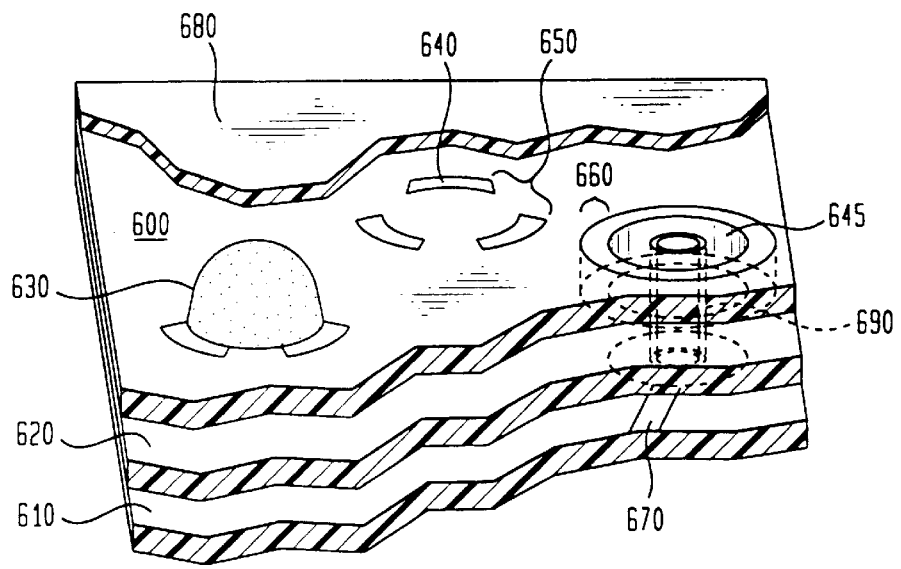
FIG. 14 shows a perspective view of a still further alternate embodiment having a ground layer according to the present invention.

Referring now to FIG. 14, an alternate embodiment of the present invention further includes a ground plane 600 overlying and coupled to the first surface of the flex circuit 620. The ground plane 800 is used to electrically ground selective bumps 630 which are coupled to the conductive pads 640 and further has combined effect of reducing the interconnection impedance between the bumps and a supporting substrate and substantially eliminating much of the electrical interference, due to capacitive and inductive coupling, between adjacent bumps. The bumps 630 are plated to the conductive pads 640/645. However, alternately, solder balls or solid core solder balls may be coupled to the pads 650/655. If it is desired to have a particular bump 630 electrically grounded, at least one conductive region 650 will be provided to couple the pad 640 to the ground layer 600. If it is not desired to have a particular bump 630 electrically grounded to the ground layer 600, the bump pad 645 will be electrically isolated from the ground layer 600 by an isolation gap 660. Each pad 640/645 is then electrically coupled to a conductive lead on the second side of the flex circuit 620 by a conductive through hole or a "blind via" 690, discussed in greater detail below. The compliant layer 610 is substantially identical to the compliant layer 170 of FIG. 1 and is coupled to the second surface of the flex circuit 620 isolating the conductive leads 670 which are lithographically formed on the second surface of the flex circuit 620 prior to coupling the compliant layer 610. Thus the conductive leads 670 are isolated from any non-intended electrical connections. The flex circuit 620 has been partially removed in FIG. 14 so that a portion of lead 670 may be viewed. A solder mask 680 is also applied to the exposed surface of the ground layer 600 so that the bumps 630 may be soldered/connected to respective contacts on a supporting substrate without causing an electrical short between the bumps 630.

Figure 15:
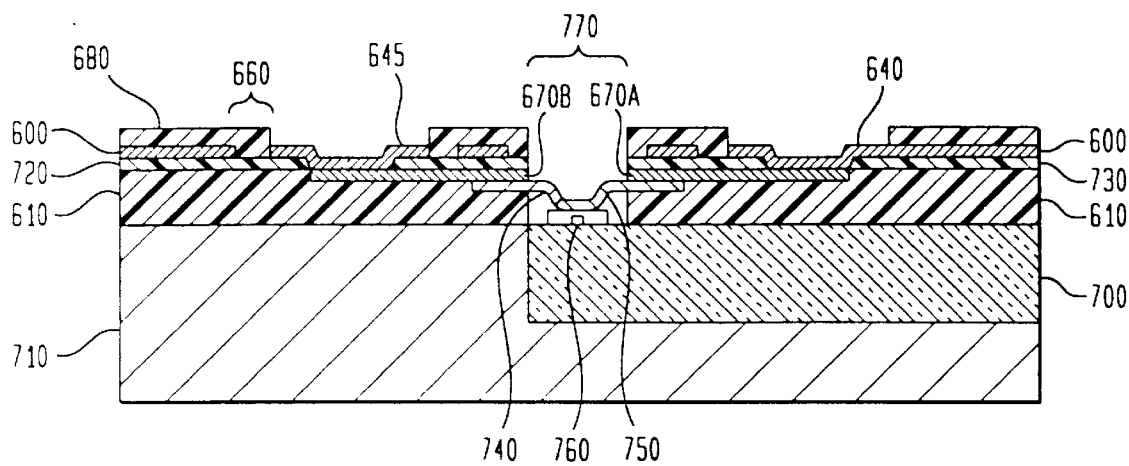
FIG. 15 shows a side view of the embodiment shown in FIG. 12 according to the present invention.

FIG. 15 shows a side view of a similar embodiment to that shown in FIG. 14 before the bumps are plated or soldered to the pads 640/645. As can be seen, pad 640 is electrically connected to the ground plane 600, while pad 645 is electrically isolated from the ground plane 600 by the combination of the isolation gap 660 and the flexible, dielectric solder mask 680 which covers the ground plane 600 and fills the isolation gap 660. In the embodiment shown in FIG. 15, the identical function of conductive through hole 690 of FIG. 14 is accomplished by using a conductive via or well on the pads 640/645 so that the back side of the well is in electrical contact with the lithographically formed first conductive leads 670A–B on the first flex circuit 720 and the second flex circuit 730. The second conductive leads 740/750 are coupled to the first conductive leads and are initially suspended within the bonding gap 770. The second conductive leads 740/750 are then separated at their respective detachment points and bonded to the die bond pads 760, as described in reference to FIGS. 4–8. A first side of the compliant layer 610 is adhered to the second surface of the first and second flex circuits 720/730 and further adhered to the protective structure 710 and the die 700 on its second surface.

Figure 16:
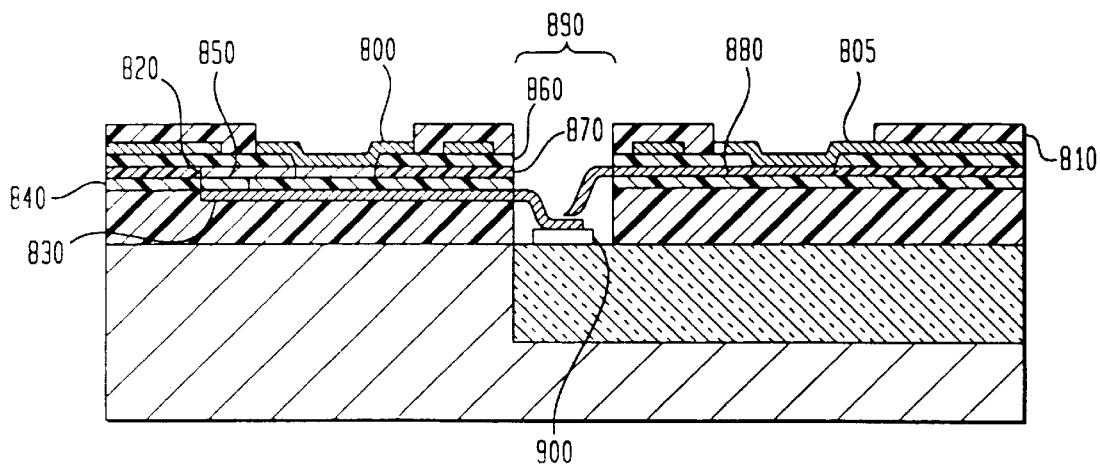
FIG. 16 shows a side view of an still further alternate embodiment having multiple wiring levels coupled to the die bond pads according to the present invention.

FIG. 16 shows a side view of a multiple circuit level embodiment of the embodiment shown in FIG. 15 before the bumps are plated or soldered to the pads 800/805. As in FIG. 15, the ground layer 810 is electrically coupled to pad 805, but is electrically isolated from pad 800. Pad 800 is further electrically coupled to multiple circuit layers comprised of conductive leads 820/830 which have been coupled, typically through a lithographic process, to either surface of flex circuit 840. However, multiple single sided flex circuits could also be used or the lead 820 could be formed on the second surface of flex circuit 880. Flex circuit 840 is laminated to flex circuit 860 by an adhesive 870. An electrical connection may be from the lead 820 on the first surface of flex circuit 840 to lead 830 on the second surface of the flex circuit 840 by a conductive through hole or by a via solution, as described above. Conductive leads 830/880 are initially suspended within the bonding gap 890. The leads 830/880 are then separated at their respective detachment points and bonded to the die bond pads 900, as described in reference to FIGS. 4–8.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

What is claimed is:

1. A semiconductor chip connection component comprising:

first and second film assemblies each including a topmost flexible dielectric film having a top surface, at least the first film assembly also including at least one lower dielectric film being arranged with a top surface confronting a bottom surface of an immediately superposed film, the film assemblies defining a bond gap extending therebetween;

first terminals mounted on the first film assembly and second terminals mounted on the second film assembly, both first and second terminals accessible from the top surfaces of the assemblies;

first leads each connected to one first terminal, the first leads extending below the first topmost film, a first set of first leads extending to the bond gap and further extending across the bond gap to the second film assembly; and second leads each connected to one second terminal, the second leads extending below the topmost film of the second film assembly to the bond gap and further extending across the bond gap to the first film assembly.

2. The component as claimed in claim 1, wherein each terminal includes a via extending through the topmost film to one lead.

3. The component as claimed in claim 1, wherein each lead includes a detachable portion within or near the bond gap.

4. The component as claimed in claim 2, further comprising a conductive layer on the top surface of the first and second film assemblies, some of the vias being electrically connected to the conductive layer, other vias being electrically isolated from the conductive layer.

5. The component as claimed in claim 2, wherein each via is a blind via having a dosed bottom end at the bottom surface of the topmost film, each such dosed bottom end confronting and margin with a flat surface of one first lead.

6. The component as claimed in claim 2, wherein the first film assembly includes a first lower film immediately beneath its topmost film and the second film assembly includes a second lower film immediately beneath its topmost film; and the component further including intermediate leads each connected to one lead of a second set of first leads, the intermediate leads extending below the first lower film to the bond gap and further extending across the bond gap to the second film assembly.

7. The component as claimed in claim 4, wherein the conductive layer has holes in alignment with the vias and one or more conductive fingers extending inwardly from the conductive layer to each connected via.

8. The component as claimed in claim 3, further comprising a compliant layer attached to the exposed surfaces of the first and second lower films.

9. A component for packaging a semiconductor chip comprising a flexible dielectric film having a plurality of electrically conductive leads and terminals thereon, each such lead including a bond region adapted for connection to a chip contact and a connecting region, the bond regions of the leads being connected to the terminals through the connecting regions so that at least one such bond region is a multiply-connected bond region connected to a plurality of the terminals by a plural set of connecting regions, the component further including means for facilitating detachment of at least one connecting region of each plural set.

10. The component as claimed in claim 9, wherein the film includes a bond window, the bond regions of the leads being aligned with the bond window, the film further including at least one disconnection window remote from the bond window, at least one connecting region of each said plural set of connecting regions extending across the at least one disconnection window so that each such connection region can be separated by engaging a tool with the connection region and forcing the tool into the disconnection window, the means for facilitating detachment including the at least one disconnection window.

11. A component for packaging a semiconductor chip comprising a dielectric element having a bond window and a plurality of electrically conductive leads and terminals on said dielectric element, each such lead including a bond region aligned with the bond window and adapted for connection to a chip contact and at least one connecting region, the bond regions of the leads being connected to the terminals through the connecting regions so that at least one such bond region is a multiply-connected bond region connected to a plurality of the terminals by a plural set of said connecting regions, the dielectric element having at least one disconnection window remote from said bond window, at least one connecting region of each said plural set of connecting regions extending across the at least one disconnection window so that each such connecting region can be separated by engaging a tool with the connecting region and forcing the tool into the disconnection window.

12. A component as claimed in claim 11 wherein said dielectric element includes a flexible dielectric film.

13. A component as claimed in claim 11 wherein said dielectric element includes a flexible dielectric film.

14. A component as claimed in claim 12 wherein said connecting regions of each said plural set include weak points.

15. A component as claimed in claim 12 wherein said connecting regions of each said plural set include weak points.

16. A component for packaging a semiconductor chip comprising a dielectric element having a plurality of electrically conductive leads and terminals on said dielectric element, each such lead including a bond region adapted for connection to a chip contact and at least one connecting region, the bond regions of the leads being connected to the terminals through the connecting regions so that at least one such bond region is connected to a plurality of the terminals by a plural set of said connecting regions the dielectric element having at least one disconnection window, at least one connecting region of each said plural set of connecting regions extending across the at least one disconnection window so that each such connecting region can be separated by engaging a tool with the connecting region and forcing the tool into the disconnection window.

17. A component for packaging a semiconductor chip comprising a dielectric element including a first dielectric layer and a plurality of electrically conductive leads and terminals on said first dielectric layer, each such lead including a bond region adapted for connection to a chip contact and at least one connecting region, the bond regions of the leads being connected to the terminals through the connecting regions so that a first one of said bond regions is connected to a plurality of said terminals by a plural set of said connecting regions and so that at least one connecting region in said plural set can be broken so as to leave said first one of said bond regions connected to less than all of said plurality of terminals.

18. A component as claimed in claim 17 wherein said first dielectric layer is a flexible layer.

19. A component as claimed in claim 17 wherein said first dielectric layer is a polymeric layer between 25 and 100 microns thick.

20. A component for packaging a semiconductor chip comprising a dielectric element including a first dielectric layer and a plurality of electrically conductive leads and terminals on a surface of said first dielectric layer, each such lead including a bond region adapted for connection to a chip contact and at least one connecting region, the bond regions of the leads being connected to the terminals through the connecting regions so that a first one of said bond regions is connected to a plurality of said terminals by a plural set of said connecting regions and so that at least one connecting region in said plural set can be broken so as to leave said first one of said bond regions connected to less than all of said plurality of terminals, said first dielectric layer having a first surface, the component further comprising a second dielectric layer overlying said first surface of said first dielectric layer, said leads extending between said first and second dielectric layers.

21. An assembly comprising:

(a) a semiconductor chip having contacts; and (b) a component including a dielectric element and a plurality of electrically conductive leads and terminals on said dielectric element, said leads including bond regions electrically connected to said contacts of said chip and connecting regions connected to said bond regions and to said terminals, a first one of said leads including a plural set of said connecting regions, each said connecting region of said plural set being connected to the bond region of said first one of said leads and to one of said terminals, said dielectric element having an aperture therein, at least one connection region of said plural set being broken at said aperture so that at least one terminal connected to such broken connection region is disconnected from the bond region of said first one of said leads.

22. An assembly as claimed in claim 21 wherein said dielectric element includes a first dielectric layer, said leads and terminals being disposed on a first surface of said first dielectric layer.

23. A component as claimed in claim 22 wherein said first dielectric layer is a flexible layer.

24. A component as claimed in claim 22 wherein said first dielectric layer is a polymeric layer between 25 and 100 microns thick.

25. A component as claimed in claim 22 further comprising a second dielectric layer overlying said first surface of said first dielectric layer, said leads extending between said first and second dielectric layers.

* * * * *